(12) United States Patent
Ohshima et al.

(10) Patent No.: US 8,203,857 B2
(45) Date of Patent: Jun. 19, 2012

(54) BOOSTER DEVICE

(75) Inventors: Shunzou Ohshima, Kosai (JP); Hiroko Aono, Kosai (JP)

(73) Assignee: Yazaki Corporation, Tokyo (JP)

( * ) Notice: Subject to any disclaimer, the term of this patent is extended or adjusted under 35 U.S.C. 154(b) by 66 days.

(21) Appl. No.: 12/760,821

(22) Filed: Apr. 15, 2010

(65) Prior Publication Data

US 2010/0264887 A1 Oct. 21, 2010

(30) Foreign Application Priority Data

Apr. 16, 2009 (JP) ................................. 2009-099779

(51) Int. Cl.
 *G05F 1/10* (2006.01)
 *G05F 3/02* (2006.01)
 *H02M 3/18* (2006.01)
 *H02M 7/00* (2006.01)
(52) U.S. Cl. .............................. 363/59; 363/60; 327/536
(58) Field of Classification Search .......... 323/268–272; 363/59, 60; 327/536
 See application file for complete search history.

(56) References Cited

U.S. PATENT DOCUMENTS

| 6,307,359 | B1 * | 10/2001 | Uchida ........................... 363/59 |
| 7,274,577 | B2 * | 9/2007 | Utsunomiya .................... 363/59 |
| 7,528,590 | B2 * | 5/2009 | Wei ................................. 323/282 |
| 2005/0127983 | A1 * | 6/2005 | Takagi et al. .................. 327/536 |
| 2005/0286200 | A1 | 12/2005 | Ohshima |
| 2009/0085535 | A1 * | 4/2009 | Wei ................................. 323/272 |

FOREIGN PATENT DOCUMENTS

JP 2006-005581 A 1/2006

* cited by examiner

*Primary Examiner* — Jue Zhang
(74) *Attorney, Agent, or Firm* — Sughrue Mion, PLLC

(57) ABSTRACT

A booster device for increasing a voltage at a voltage supply point of a power supply circuit for supplying a driving voltage to an electronic control circuit is provided. The power supply circuit includes a series-connected circuit having a diode, a resistor, and a capacitor which is connected to a DC power supply. One end of the capacitor is connected to a ground and a connection point of the resistor and the capacitor serves as the voltage supply point. The booster device includes a clamp circuit, an oscillation circuit, and a booster circuit that increase a voltage output from the DC power supply. When the voltage at the voltage supply point falls below a predetermined threshold voltage, the booster device supplies the increased voltage at the voltage supply point.

4 Claims, 6 Drawing Sheets

BOOSTER DEVICE

BACKGROUND

The present invention relates to a booster device for suppressing a reduction in an output voltage of a DC power supply when the output voltage is decreased.

For example, an electronic component installed into a vehicle is driven by an electric power being fed from a battery (DC power supply). In such battery, a battery voltage is decreased because a large electric current is output from the battery during the starter cranking. Further, when such a condition is combined together that an ambient temperature is low, in some cases the battery voltage is decreased to about 3 to 4 V from 12 to 14 V as the voltage in a normal condition. For this reason, the battery cannot feed the voltage that various electronic components installed into the vehicle need. Concretely, a lowest operating voltage of the electronic components such as a control circuit, semiconductor switches, and the like installed into the vehicle is normally about 6 V, so that in some cases the battery cannot normally operate these electronic components when the battery voltage is decreased to about 3 to 4 V.

Then, an explanation will be made in detail with reference to FIG. 6 hereunder. FIG. 6 is a circuit diagram showing a configuration of a load driving circuit in the related art. As shown in FIG. 6, a MOSFET (T101) is provided between a battery 106 (output voltage VB) and a load Rz, and a gate of the MOSFET (T101) is connected to a control IC 101. Normally, an NMOS is employed as the MOSFET(T101). Also, the control IC 101 includes a charge pump 102 for driving the NMOS, an overcurrent protection circuit 103 for protecting the MOSFET (T101) and wirings from an overcurrent, a control logic circuit 104, and a driver 105. Then, ON/OFF of the MOSFET (T101) is switched by the ON/OFF operation of a switch SW1.

Also, a positive-side output terminal (drain of the MOSFET) of the battery 106 is connected to a ground via a diode DA1, a resistor RA1, and a capacitor CA1. Then, a connection point between the resistor RA1 and the capacitor CA1 is connected to the control IC 101. That is, a stabilized voltage VBB is generated by a circuit that consists of the diode DA1, the resistor RA1, and the capacitor CA1, and this voltage VBB is used as a power supply voltage of the control IC 101. The voltage VBB is given by VBB=VB−Vf1, where Vf1 is a forward voltage drop of diode DA1. In this case, a voltage drop in the resistor RA1 is neglected because a resistance value of the resistor RA1 is about 3.9 Ω.

Here, in the condition that the output voltage VB of the battery 106 is decreased due to the starter cranking, or the like, a decrease of the voltage VBB can be prevented by the diode DA1 and the capacitor CA1 when this reduction time is a short time. However, when a decrease of the output voltage VB of the battery 106 extends over a long time that exceeds 1 second, the electric charges accumulated in the capacitor CA1 are consumed by the control IC 101, and thus the voltage VBB is decreased.

A constant voltage circuit, a constant current circuit, an amplifier circuit, etc. are contained in the control IC 101, and a large number of electronic components such as operational amplifiers, comparators, etc. are used. Therefore, a head room and a foot room of these components must be ensured, and a lowest operating voltage becomes about 6V in the normal control IC.

In contrast, the output voltage VB of the battery 106 is decreased to about 3 to 4 V at a time of starter cranking, as described above. Therefore, in order to operate normally the circuits in the control IC 101 by this voltage, the head room and the foot room of the operational amplifiers and the comparators must be made smaller, and thus the operational amplifiers and the comparators must be designed to have a special configuration. This situation yields an increase in cost of the IC. Also, when the voltage VBB is decreased, a boosting capability of the charge pump 102 is lowered. Therefore, the number of step-up stages of the charge pump 102 must be increased. This situation also results in an increase in cost.
[Patent Literature 1] JP-A-2006-5581

As described above, in the load driving circuit in the related art, when the output voltage of the DC power supply (e.g., the battery) is decreased for some reason (e.g., the starter cranking) and then falls below the lowest driving voltage that is applicable to drive the electronic component (e.g., the element provided in the control IC), in some cases such output voltage cannot cause respective electronic components to operate normally. As a result, the demand that a reduction in the output voltage of the DC power supply should be suppressed by all means is escalating.

SUMMARY

The present invention has been made to solve such problem in the related art, and it is an object of the present invention to provide a booster device capable of suppressing a reduction in an output voltage of a DC power supply when the output voltage is decreased.

In order to achieve the above object, according to the present invention, there is provided a booster device for increasing a voltage at a voltage supply point of a power supply circuit for supplying a driving voltage to an electronic control circuit, the power supply circuit including a series-connected circuit having a diode, a resistor, and a capacitor, wherein the series-connected circuit is connected to a DC power supply, and wherein one end of the capacitor is connected to a ground and a connection point of the resistor and the capacitor serves as the voltage supply point,
the booster device comprising:
a booster circuit that increases a voltage output from the DC power supply and supplies the voltage to the voltage supply point,
wherein, when the voltage at the voltage supply point falls below a predetermined threshold voltage, the booster circuit increases the voltage at the voltage supply point.

According to the present invention, there is also provided a booster device for increasing a voltage at a voltage supply point of a power supply circuit for supplying a driving voltage to an electronic control circuit (IC), the power supply circuit including a first series-connected circuit having a diode, a resistor, and a capacitor which is connected to a DC power supply, wherein one end of the capacitor is connected to a ground and a connection point of the resistor and the capacitor serves as the voltage supply point,
the booster device comprising:
a clamp circuit that outputs a drive disabling signal when the voltage at the voltage supply point is equal to or greater than a predetermined threshold voltage, and outputs a drive enabling signal, which is generated by inverting the drive disabling signal, when the voltage at the voltage supply point is smaller than the threshold voltage;
an oscillation circuit that outputs a pulse signal when the drive enabling signal is output from the clamp circuit; and
a booster circuit that increases the voltage at the voltage supply point by supplying electric charges, which are accumulated by a voltage output from the DC power supply, to the voltage supply point when the pulse signal is output from the oscillation circuit.

Preferably, wherein the clamp circuit includes: a second series-connected circuit having a Zener diode (ZD1), a first resistor (R21), and a second resistor (R22), and provided between the voltage supply point and the ground; and a first switching element (Q10) having a control electrode which is connected to a connection point of the first resistor and the second resistor, and the first switching element is switched to ON/OFF in response to a voltage generated in the second resistor. The clamp circuit outputs the drive disabling signal when the first switching element is in an ON state, and outputs the drive enabling signal when the first switching element is in an OFF state.

Preferably, the oscillation circuit includes a first capacitor (C1) which is charged when the drive enabling signal is supplied to the first capacitor; a second switching element (Q1) which is turned ON based on a charging voltage of the first capacitor (C1); and a third switching element (Q2) which is turned OFF when the second switching element (Q1) is turned ON. The first capacitor (C1) starts discharging thereof when the third switching element (Q2) is turned OFF, and starts charging thereof again when the second switching element (Q1) is turned OFF due to a voltage drop of the first capacitor (C1) and then the third switching element (Q2) is turned ON, so that repetition of charging/discharging operations outputs the pulse signal.

Preferably, the oscillation circuit includes the first capacitor (C1) provided between an output terminal of the clamp circuit and the ground, a parallel circuit, a third series-connected circuit, a fourth series-connected circuit and a fifth series-connected circuit. The parallel circuit includes a first series connection having a third resistor (R1), a fourth resistor (R2), and a second switching element (Q1) and a second series connection having a fifth resistor (R5), a sixth resistor (R6), and a third switching element (Q2). The first series connection is connected in parallel with the second series connection, one end of the parallel circuit is connected to the voltage supply point (P2) and other end of the parallel circuit is connected to a seventh resistor (R3). A control electrode of the second switching element (Q1) is connected to an output terminal of the clamp circuit, and one end of the second switching element (Q1) is connected to the control electrode of the third switching element (Q2) via a twelfth resistor (R4). The third series-connected circuit includes a fourth switching element (Q3) whose control electrode is connected to a connection point of the third resistor (R1) and the fourth resistor (R2), an eighth resistor (R9), and a ninth resistor (R10), one end of the third series-connected circuit is connected to the voltage supply point (P2) and other end of the third series-connected circuit is connected to the ground. The fourth series-connected circuit includes a fifth switching element (Q4) whose control electrode is connected to a connection point of the fifth resistor (R5) and the sixth resistor (R6), a tenth resistor (R7), and a first diode (D1), and one end of the fourth series-connected circuit is connected to the voltage supply point (P2) and other end of the fourth series-connected circuit is connected to the output terminal of the clamp circuit. The fifth series-connected circuit includes a second diode (D2), an eleventh resistor (R8), and a sixth switching element (Q5), and one end of the fifth series-connected circuit is connected to the output terminal of the clamp circuit and other end is connected to the ground. A control electrode of the sixth switching element (Q5) is connected to a connection point of the eighth resistor (R9) and the ninth resistor (R10).

A connection point of the eleventh resistor (R8) and the sixth switching element (Q5) serves as an output point of the pulse signal.

Preferably, the booster circuit includes a second capacitor (C2) and a third capacitor (C3), one ends of which are connected to the DC power supply and other ends of which repeat alternately grounded/non-grounded states in accordance with a change of ON/OFF of the pulse signal. The booster circuit supplies electric charges, which are charged when the other end of the second capacitor (C2) is grounded, to the third capacitor (C3) when the other end of the second capacitor (C2) is changed into the non-grounded state, and charges the electric charges, which are supplied from the second capacitor (C2) into the third capacitor (C3) when the other end of the third capacitor (C3) is grounded. The booster circuit supplies the electric charges to the voltage supply point (P2) to increase the voltage at the voltage supply point (P2) when the other end of the third capacitor (C3) is changed into the non-grounded state.

In the booster device according to the present invention, even in the situation that the output voltage of the DC power supply is decreased and thus the voltage (VBB) at a power feed point is decreased to the level at which the electronic control circuit cannot operate normally, the booster device is operated to increase the voltage VBB when the voltage VBB is below the threshold voltage Vth. Therefore, the electronic control circuit can operate normally with the output voltage. Also, there is no need that the special IC that is operable normally even when the voltage VBB is decreased. Therefore, such a situation can be avoided that an increase in cost is brought about.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
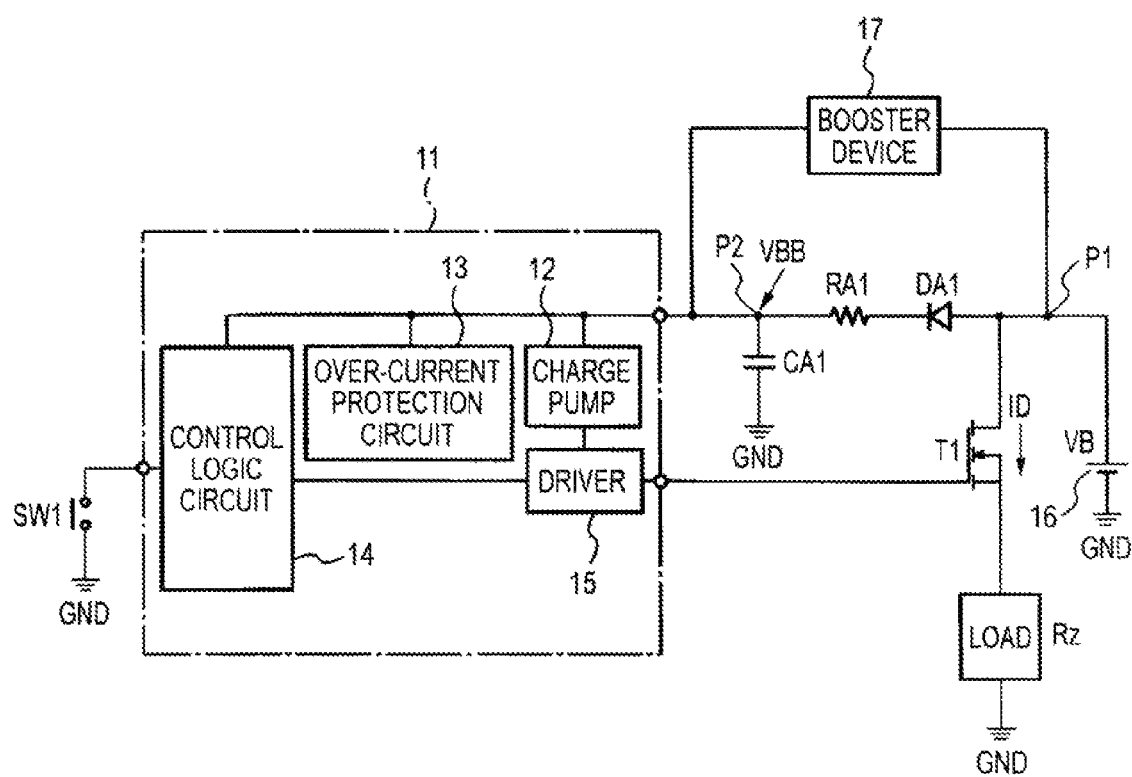
FIG. 1 is a circuit diagram showing a configuration of a load driving circuit into which a booster device according to the present invention is installed.

An embodiment of the present invention will be explained with reference to the drawings hereinafter. FIG. 1 is a circuit diagram showing a configuration of a load driving circuit into which a booster device according to the present invention is installed. As shown in FIG. 1, in this load driving circuit, an N-type MOSFET (T1) is provided between a battery 16 (DC power supply) of the output voltage VB and the load Rz, and the drive/stop of the load Rz is controlled by switching ON/OFF of the MOSFET (T1). A gate of the MOSFET (T1) is connected to a control IC 11 (electronic control circuit).

Also, a point P1 as a connection point between a positive-side terminal of the battery 16 and a drain of the MOSFET (T1) is connected to GND via the diode DA1, the resistor RA1, and the capacitor CA1. Also, a point P2 (the voltage VBB) as a connection point between the resistor RA1 and the capacitor CA1 is connected to the control IC 11. A booster device 17 is provided between the point P1 and the point P2.

Also, the control IC 11 includes a charge pump 12 for driving the N-type MOSFET (T1), an overcurrent protection circuit 13 for protecting the MOSFET (T1) and wirings of the load circuit from the overcurrent, a control logic circuit 14, and a driver 15 for outputting a driving signal to a gate of the MOSFET (T1). Also, ON/OFF of the MOSFET (T1) can be switched by the ON/OFF operation of the switch SW1.

Figure 2:
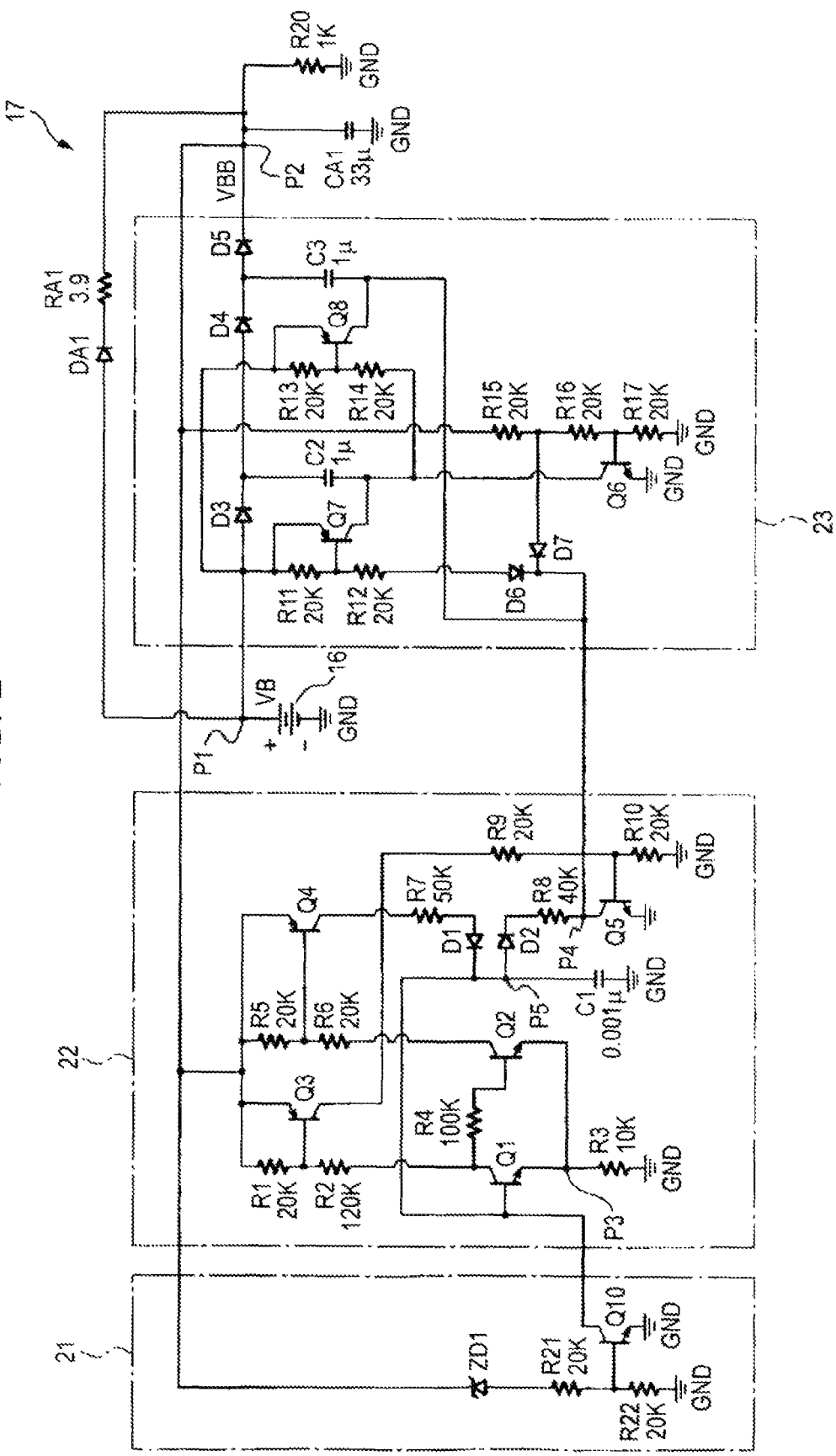
FIG. 2 is a circuit diagram showing a configuration of a booster device according to an embodiment of the present invention.

FIG. 2 is a circuit diagram showing a detail configuration of the booster device 17 as a feature portion of the present invention. As shown in FIG. 2, the booster device 17 includes a clamp circuit 21, an oscillation circuit 22, and a booster circuit 23.

The clamp circuit 21 is arranged between the point P2 (the voltage VBB) and GND, and has a series connection of a resistor R21 and a resistor R22, and a Zener diode ZD1. Also, the clamp circuit 21 has a transistor Q10 (first switching element). A base of the transistor Q10 is connected to a connection point between the resistor R21 (first resistor) and the resistor R22 (second resistor).

Also, in the clamp circuit 21, a Zener voltage of the Zener diode ZD1 and resistance values of the resistors R21, R22 are set appropriately. Thus, when a voltage at the point P2 is higher than a predetermined voltage, a voltage across the resistor R22 can be set to exceed 0.6 V by setting the Zener voltage and the resistance values. In the present embodiment, this predetermined voltage is set to a threshold voltage Vth (e.g., 7.2 V) that is higher than the lowest operating voltage of the control IC 11. That is, the Zener voltage of the Zener diode ZD1 and the resistance values of the resistors R21, R22 are set such that the transistor Q10 is turned ON (a drive disabling signal is output) when the voltage VBB at the point P2 is more than the threshold voltage Vth whereas the transistor Q10 is turned OFF (a drive enabling signal is output) when the voltage VBB is below the threshold voltage Vth.

Here, in FIG. 2, a numerical value set forth under each reference symbol denotes a concrete value of each element. For example, "20K" set forth under the resistor R21 denotes that the resistance of 20 KΩ is used as an example of this resistor R21.

The oscillation circuit 22 is provided between the point P2 and GND. The oscillation circuit 22 has a series-connected circuit having a resistor R1 (third resistor), a resistor R2 (fourth resistor), and a transistor Q1 (second switching element), and a series-connected circuit having a resistor R5 (fifth resistor), a resistor R6 (sixth resistor), and a transistor Q2 (third switching element). Both emitters of the transistors Q1 and Q2 are connected mutually at a point P3. Also, this point P3 is connected to GND via a resistor R3 (seventh resistor). Also, a collector of the transistor Q1 is connected to a base of the transistor Q2 via a resistor R4 (twelfth resistor). In this case, a resistance value of the resistor R6 is set smaller than a resistance value of the resistor R2. That is, R2 (120 KΩ)>R6 (20 KΩ).

A base of the transistor Q1 is connected to a collector of the foregoing transistor Q10, and also is connected to GND via a capacitor C1 (first capacitor).

Also, the oscillation circuit 22 has a series-connected circuit having a transistor Q3 (fourth switching element), a resistor R9 (eighth resistor), and a resistor R10 (ninth resistor). An emitter of the transistor Q3 is connected to the point P2, and the resistor R10 is connected to GND. A base of the transistor Q3 is connected to a connection point of the resistor R1 and the resistor R2.

Also, a connection point of the resistor R9 and the resistor R10 is connected to a base of a transistor Q5 (sixth switching element). An emitter of the transistor Q5 is connected to GND, and a collector of the transistor Q5 (point P4) is connected to an upper terminal (point P5) of the capacitor C1 in FIG. 2 via a resistor R8 (eleventh resistor), and a diode D2 (second diode).

Also, the oscillation circuit 22 has a series-connected circuit having a transistor Q4 (fifth switching element), a resistor R7 (tenth resistor), and a diode D1 (first diode). The diode D1 is connected to the point P5, and a base of the transistor Q4 is connected to a connection point of the resistor R5 and the resistor R6.

Also, in the oscillation circuit 22, the charging of the capacitor C1 is started when the transistor Q10 is in its OFF (when the drive enabling signal is output), then the transistor Q1 is turned ON after the charging of the capacitor C1 is completed, and at the same time the transistor Q4 is turned OFF and the transistor Q5 is turned ON, and thus the discharging of the capacitor C1 is started. The oscillation circuit 22 can generate pulse signals at the point P4 by repeating the above operation. The details will be described later.

Then, the booster circuit 23 has a capacitor C2 (second capacitor) and a capacitor C3 (third capacitor). One end of the capacitor C2 is connected to the point P1 as a positive terminal of the battery 16 via a diode D3, and also is connected to the point P2 via a diode D4 and a diode D5. Also, the other end of the capacitor C2 is connected to GND via a transistor Q6.

One end of the capacitor C3 is connected to the point P1 via the diode D4 and the diode D3, and also is connected to the point P2 via the diode D5. Also, the other end of the capacitor C3 is connected to a point P4 in the oscillation circuit 22.

Also, the booster circuit 23 has a series-connected circuit having a resistor R15, a resistor R16, and a resistor R17. The resistor R15 is connected to the point P2, and the resistor R17 is connected to GND. A connection point of the resistor R16 and the resistor R17 is connected to a base of the transistor Q6. A connection point of the resistor R15 and the resistor R16 is connected to the point P4 via a diode D7.

Also, a series-connected circuit having a resistor R11 and a resistor R12 is connected to the point P1, and also is connected to the point P4 via a diode D6. A connection point of the resistor R11 and the resistor R12 is connected to a base of a transistor Q7. An emitter of the transistor Q7 is connected to the point P1, and a collector thereof is connected to a terminal of the capacitor C2 which is a lower side terminal in FIG. 2. The transistor Q7 is provided to connect a terminal of the capacitor C2 (a lower side terminal of the capacitor C2 in FIG. 2) to the battery 16 when the capacitor C2 is brought into the non-grounded state.

Also, a series-connected circuit having a resistor R13 and a resistor R14 is connected to the point P1, and the resistor R14 is connected to a lower terminal of the capacitor C2 in FIG. 2. A connection point of the resistor R13 and the resistor R14 is connected to a base of a transistor Q8. An emitter of the transistor Q8 is connected to the point P1, and a collector of the transistor Q8 is connected to a lower terminal of the capacitor C3 in FIG. 2. The transistor Q8 is provided to connect a terminal (a lower terminal of the capacitor C3 in FIG. 2) to the battery 16 when the capacitor C3 is brought into the non-grounded state.

Next, an operation of the booster device 17 constructed as above according to the present embodiment will be explained hereunder. The output voltage VB of the battery 16 shown in FIG. 2 causes the capacitor CA1 to charge via the diode DA1 and the resistor RA1, and generates the stabilized voltage VBB at the point P2 (voltage supply point). This voltage VBB is given by VBB=VB−Vf1, where the forward voltage of the diode DA1 is Vf1, and the voltage VBB becomes lower than the output voltage VB of the battery 16. In this case, a voltage drop in the resistor RA1 can be neglected because a resistance value of the resistor RA1 is very small (in the present embodiment, 3.9 Ω).

Then, the output voltage VB of the battery 16 is decreased, and accordingly the voltage VBB is decreased. When the voltage VBB falls below the threshold voltage Vth (VBB<Vth), the booster device 17 raises the voltage VBB at the point P2 by the operation described later. The voltage VBB is fed to the control IC 11 (see FIG. 1), and an electric power is consumed by the control IC 11. A resistor R20 shown in FIG. 2 indicates an equivalent resistor of the control IC 11, and a boosting capability of the booster device 17 must be enhanced as the resistor R20 becomes smaller.

Then, an operation of the clamp circuit 21 will be explained concretely hereunder. In the clamp circuit 21 shown in FIG. 2, when the voltage VBB exceeds the Zener voltage of the Zener diode ZD1, an electric current flows through the route of the voltage VBB→the Zener diode ZD1→the resistor R21→the resistor R22→GND. Then, when a voltage drop in the resistor R22 exceeds 0.6 V, the transistor Q10 is turned ON. The resistance values of the resistors R21, R22 and the Zener voltage of the Zener diode ZD1 are set in such a way that the voltage VBB at this time becomes equal to the threshold voltage Vth.

In the period that the transistor Q10 is in its ON state, the non-grounded terminal (in FIG. 2, the upper terminal) of the capacitor C1 provided to the oscillation circuit 22 is connected to GND via the transistor Q10, and simultaneously a base of the transistor Q1 is grounded. Therefore, an OFF state of the transistor Q1 is maintained, and thus the charging of the capacitor C1 is not started. As a result, an operation of the oscillation circuit 22 is stopped. That is, when the voltage VBB is in excess of the threshold voltage Vth, the drive disabling signal is output to the oscillation circuit 22.

Next, an operation of the oscillation circuit 22 will be explained hereunder. As described above, when the voltage VBB at the point P2 is in excess of the threshold voltage Vth (VBB≧Vth), the transistor Q10 of the clamp circuit 21 is turned ON. Therefore, the transistor Q1 is held in its OFF state, and the oscillation operation is stopped. At this time, the transistor Q2 is held in its ON state, the transistor Q3 is held in its OFF state, the transistor Q4 is held in its ON state, and the transistor Q5 is held in its OFF state. As a result, the voltage at the point P4 as a connection point of the transistor Q5 and the resistor R8 is kept at an L level, and thus the boosting operation is not executed by the booster circuit 23.

Also, when the voltage at the point P3 as the emitters of the transistors Q1, Q2 is assumed as VAH and a base-emitter voltage of the transistor Q4 is assumed as 0.6 V, the voltage VAH can be given by a following equation (1).

$$VAH=(VBB-0.6)*R3/(R3+R6) \quad (1)$$

Here, when the voltage VBB at the point P2 is below the threshold voltage Vth (VBB<Vth), the transistor Q10 is turned OFF, and thus the clamp of the base voltage of the transistor Q1 is released. Accordingly, the grounded state of the point P5 as the non-grounded terminal of the capacitor C1 is released. Then, as described above, since the transistor Q4 is still in its ON state, an electric current flows through the route of the voltage VBB→the transistor Q4→the resistor R7→the diode D1→the capacitor C1→GND, and thus the charging of the capacitor C1 is started.

When a voltage of the non-grounded terminal (point P5) of the capacitor C1 is assumed as VC1, this voltage VC1 is increased because the charging of the capacitor C1 is started. When VC1=VAH+0.6 is attained, the transistor Q1 is turned ON. Accordingly, the transistor Q2 is turned OFF. Also, because the transistor Q1 is turned ON, the transistor Q3 and the transistor Q5 are turned ON, and thus the voltage at the point P4 is at a low level.

When a voltage at the point P3 at this time is assumed as VAL and a base-emitter voltage of the transistor Q3 is assumed as 0.6 V, the voltage VAL can be given by a following equation (2).

$$VAL=(VBB-0.6)*R3/(R3+R2) \quad (2)$$

Here, since R6<R2 as described above, a relation between the equation (1) and the equation (2) is given by VAH>VAL.

Also, since the transistor Q2 is turned OFF, the transistor Q4 is turned OFF. Also, since the transistor Q1 is turned ON, both the transistors Q3, Q5 are turned ON. Accordingly, the charging route of the above capacitor C1 through the route of the voltage VBB→the transistor Q4→the resistor R7→the diode D1→the capacitor C1→GND is shut off, and the discharging of the electric charges that are charged in the capacitor C1 through the route of the capacitor C1→the diode D2→the resistor R8→the transistor Q5→GND is started. As a result, a base voltage of the transistor Q1 is decreased, and then the transistor Q1 is turned OFF when VC1−0.6=VAL is attained. Accordingly, the transistor Q5 is turned OFF, and an electric potential of the point P4 is pulled up through the route of the output voltage VB→the resistor R11→the resistor R12→the diode D6→the point P4, and thus the voltage at the point P4 goes to a High level.

Then, since the transistor Q3 is turned OFF and also the transistor Q5 is turned OFF, the discharging route of the capacitor C1 is shut down. Also, since the transistor Q2 is turned ON and thus the transistor Q4 is turned ON, the above charging route of the capacitor C1 is reconstructed.

The capacitor C1 is charged, and then the electric charges are supplied to the point P2 by the operation of the booster circuit 23 (the details will be described later) in the course of the subsequent discharge. Therefore, the voltage VBB is increased. Thus, the transistor Q10 in the clamp circuit 21 is turned ON, and the transistor Q1 is clamped once. However, the voltage VBB is decreased immediately, and thus the transistor Q10 is turned OFF. Therefore, the clamp of the transistor Q1 is released so that the charging operation of the capacitor C1 is restarted and the transistor Q1 is turned on when VC1 becomes greater than the voltage specified by VAL+0.6V.

Also, when the voltage VBB is decreased due to a large power consumption in the resistor R20 (corresponding to the control IC 11) so that VBB is much smaller than Vth, VBB<Vth is kept even though the boosting operation is executed by ON/OFF of the transistor Q5. As a result, the oscillation circuit 22 performs the continuous operation without a halt period (i.e., the clamping operation of the clamp circuit 21 does not occur).

When the above operation is repeated, the voltage at the point P4 repeats alternately "High Level" and "Low Level". Accordingly, the pulse signal is output to the booster circuit 23.

In other words, in the oscillation circuit 22, when the clamping of the clamp circuit 21 is released once, the charging/discharging of the capacitor C1 is repeated by the ON/OFF actions of the transistors Q1, Q2 and the ON/OFF action of the transistor Q10. According to these actions, the "High Level" and "Low Level" are repeated alternately at the point P4 to generate the pulse signal, and this pulse signal is output to the booster circuit 23.

Next, an operation of the booster circuit 23 will be explained hereunder. When the pulse signal being output from the oscillation circuit 22 is at "High Level" (the transistor Q5 is in its OFF state), the transistor Q6 is turned ON by the voltage generated by the resistor R17, and a lower terminal of the capacitor C2 in FIG. 2 is grounded. At this time, since the transistor Q7 is still in its OFF state, some electric charges are accumulated in the capacitor C2 by the voltage VB that is fed from the battery 16.

Then, when the pulse signal is switched to "Low Level" (the transistor Q5 is turned ON), a connection point of the resistor R15 and the resistor R16 is connected to GND via the diode D7. Therefore, the transistor Q6 is turned OFF and the capacitor C2 is brought into a non-grounded state, and also the transistor Q7 is turned ON. Also, a lower terminal of the capacitor C3 in FIG. 2 is connected to GND via the transistor Q5. Therefore, the electric charges accumulated in the capacitor C2 are moved to the capacitor C3 via the diode D4. That is, the electric charges accumulated in the capacitor C2 are moved to the capacitor C3, and are accumulated in the capacitor C3.

Then, when the pulse signal is switched to "High Level" again, a lower terminal of the capacitor C2 in FIG. 2 is grounded, and a lower terminal of the capacitor C3 in FIG. 2 is disconnected from GND, and then the transistor Q8 is turned ON. Therefore, the electric charges are accumulated again in the capacitor C2 by the voltage supplied from the battery 16, and also the electric charges accumulated in the capacitor C3 are supplied to the point P2 via the diode D5.

That is, when the pulse signal that is switched to "Low Level" and "High Level" alternately is supplied to the booster circuit 23 from the oscillation circuit 22, the electric charges are accumulated into the capacitor C2 every one period of the pulse signal. The electric charges are moved to the capacitor C3 and accumulated therein, and the electric charges accumulated in the capacitor C3 are supplied to the point P2. Then, the voltage VBB at the point P2 is increased by the supply of these electric charges.

From the above, it is appreciated that, when the voltage VBB at the point P2 falls below the threshold voltage Vth, the clamping of the clamp circuit 21 is released and the pulse signal is output from the oscillation circuit 22 and then, when the pulse signal is supplied to the booster circuit 23, the electric charges are supplied to the point P2 and thus the voltage VBB at the point P2 is raised. In other words, when the voltage VBB at the point P2 is decreased, this voltage VBB can be raised.

Then, when the voltage VBB is increased and reaches the threshold voltage Vth steadily, the transistor Q1 is clamped in its OFF state by the clamp circuit 21. Therefore, the booster circuit 23 is not operated and the further supply of electric charges is stopped.

Figure 3:
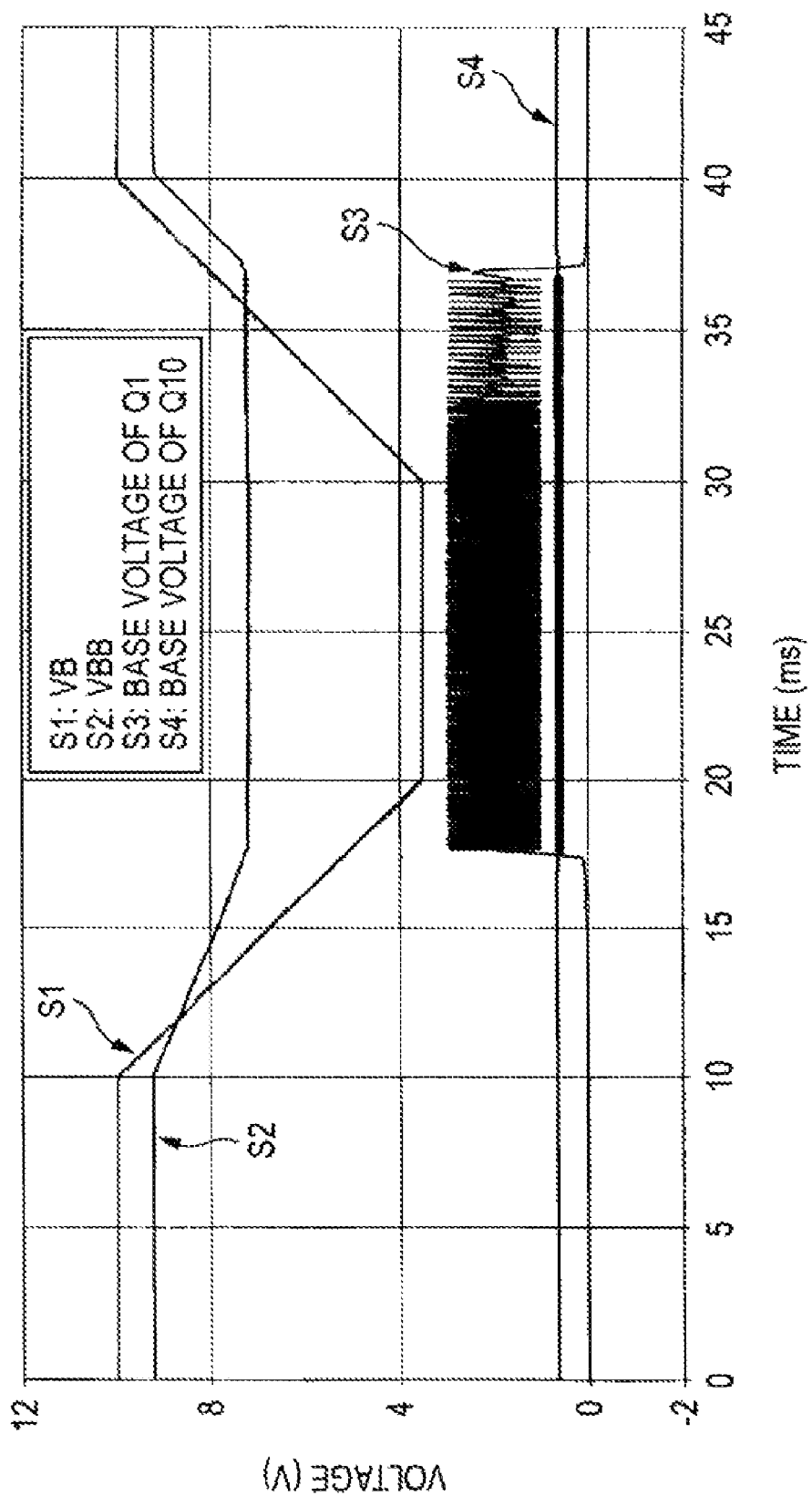
FIG. 3 is a characteristic view showing changes in voltages VB, VBB and base voltages of transistors Q1, Q10 in the booster device according to the embodiment of the present invention.

Next, the simulation results obtained when the booster device 17 shown in FIG. 2 is operated will be explained with reference to FIGS. 3 to 5 hereunder. FIG. 3 is a timing chart showing respective changes in the voltage VB (curve S1), the voltage VBB at the point P2 (curve S2), the base voltage of the transistor Q10 (curve S4), and the base voltage of the transistor Q1 (curve S3). FIG. 3 shows the case where the voltage VB is changed in the way of 10V→3.5V→10V. Also, the threshold voltage Vth to be set in the clamp circuit 21 is set to 7.2 V.

Figure 4:
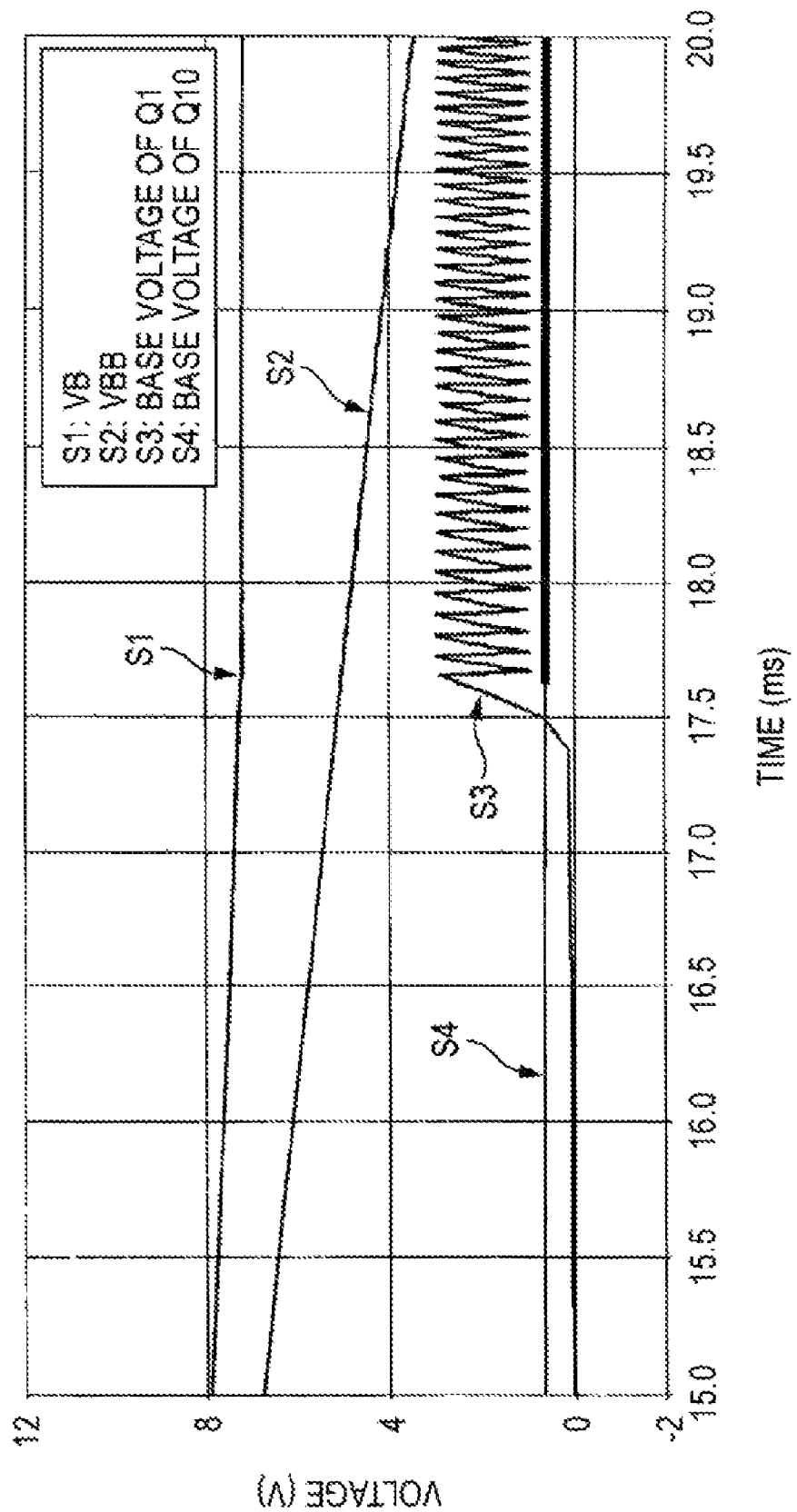
FIG. 4 is a characteristic view showing a part of a time zone of the characteristic view shown in FIG. 3 in an enlarged manner.
Figure 5:
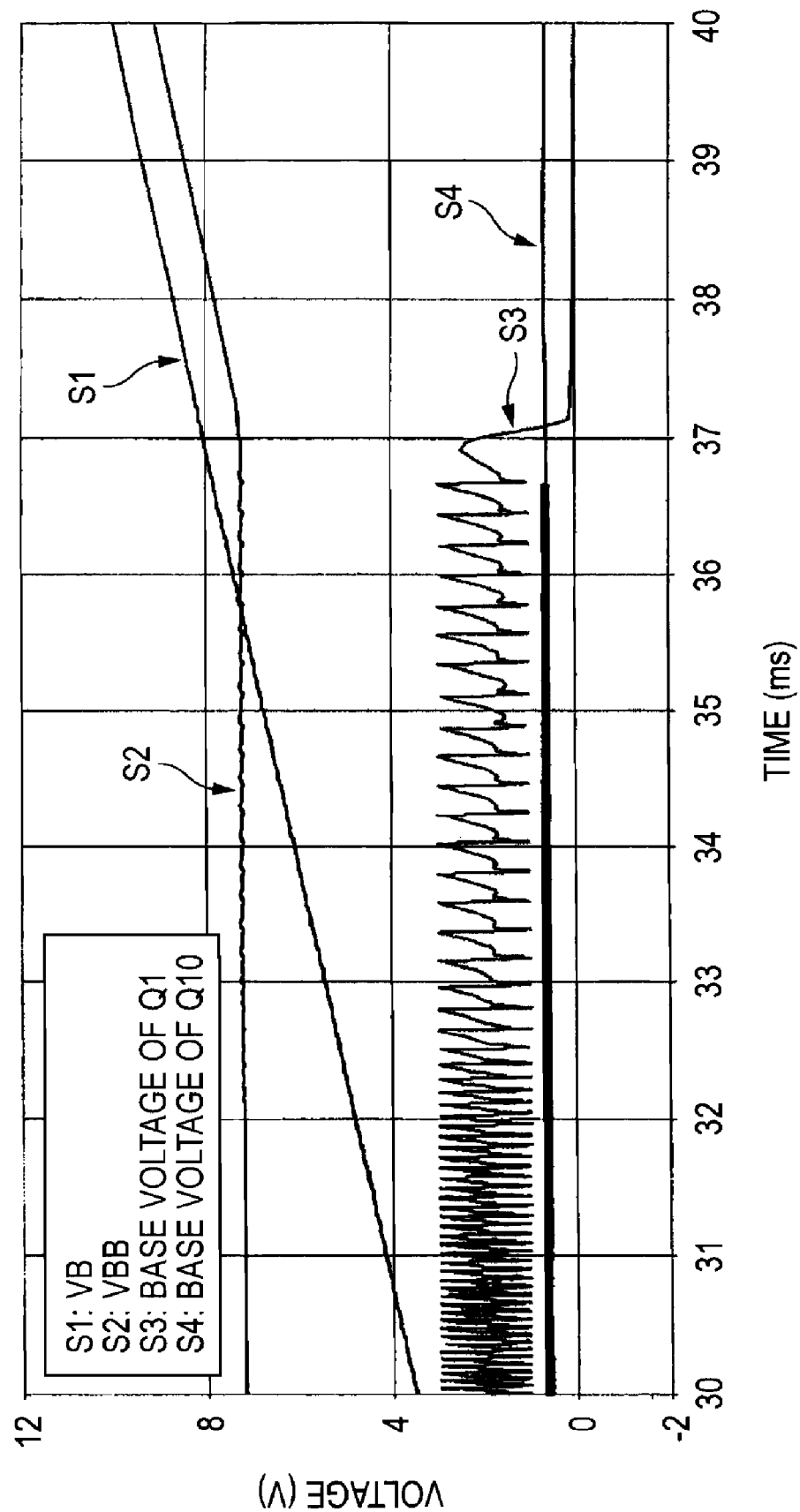
FIG. 5 is another characteristic view showing a part of a time zone of the characteristic view shown in FIG. 3 in an enlarged manner.
Figure 6:
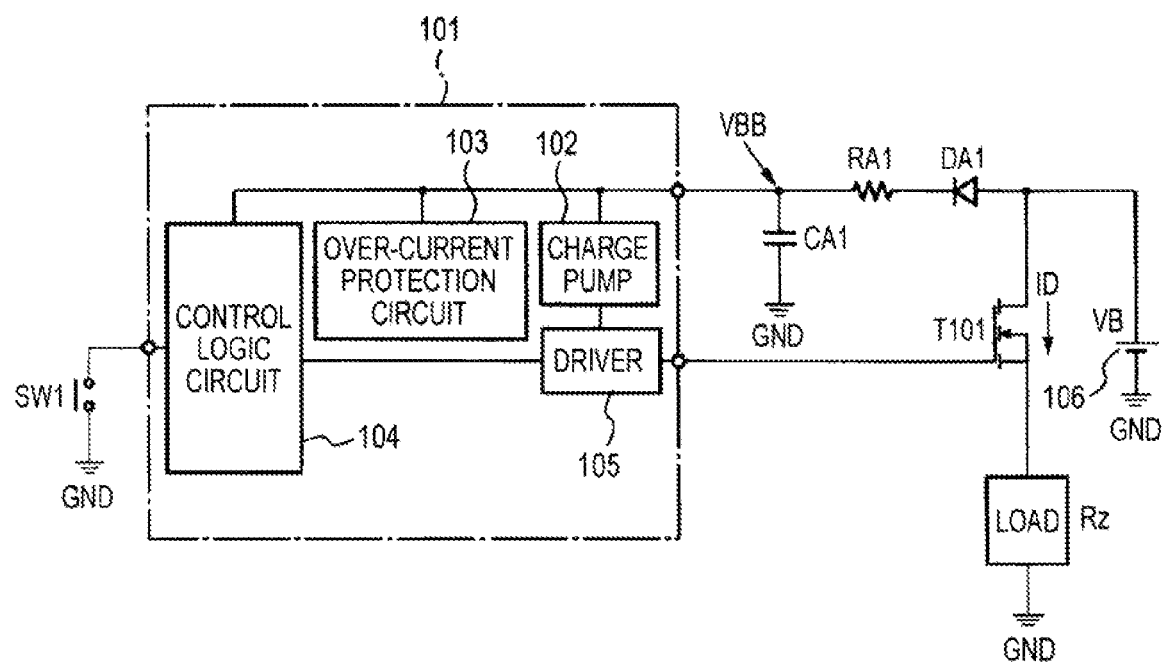
FIG. 6 is a circuit diagram showing a configuration of a load driving circuit in the related art.

Also, FIG. 4 is an enlarged view showing a waveform in a time interval from 15.0 ms to 20.0 ms in FIG. 3. Also, FIG. 5 is an enlarged view showing a waveform in a time interval from 30.0 ms to 40.0 ms in FIG. 3.

In FIG. 3, the simulation is started from a point of time t=0 ms at VB=10 V and VBB=9.2 V. The voltage VB starts to fall down from t=10 ms, and correspondingly the voltage VBB also starts to fall down. Because of the presence of the capacitor CA1 (33 μf), a voltage drop of the voltage VBB is delayed from the output voltage VB of the battery 16. When the voltage VBB is decreased to 7.2 V (the threshold voltage Vth), the base voltage of the transistor Q10 is decreased. Then, the oscillation circuit 22 starts the operation.

As a result, even though the output voltage VB of the battery 16 is decreased, the voltage VBB is held at a constant voltage (=7.2 V). The base voltage of the transistor Q10 is 680 mV at the voltage VBB=9.2 V, and is decreased to 650 mV at the voltage VBB=7.2 V at which the oscillation circuit 22 starts the operation. Then, the base voltage of the transistor Q10 is decreased to 610 mV while the output voltage VB of the battery 16 goes to VB=3.5 V, but the base voltage of the transistor Q10 never falls below this value, that is 610 mV, as far as the voltage VBB=7.2 V is kept.

In this case, the base voltage of the transistor Q10 shows a very small change of voltage, e.g., this voltage is decreased from 680 mV to 610 mV. Hence, this base voltage shows a change that does not appear obviously in the scale (one division is 4V) in FIG. 3 to FIG. 5. Therefore, in FIG. 3 to FIG. 5, an interval in which the base voltage of the transistor Q10 is varying is indicated with a thick line. That is, in the interval indicated with a thick line, the base voltage of the transistor Q10 shows a waveform that is varied vertically within a range of about several tens mV.

Also, as shown in FIG. 4, the oscillating action is started at t=17.5 ms, and an oscillation period is shortened gradually as the output voltage VB of the battery 16 falls down. Then, as shown in FIG. 5, it is appreciated that, when the output voltage VB is increased from 3.5 V, the oscillation period is prolonged gradually. This is because a clamp time which is created in the clamp circuit 21 due to each pulse which is output from the oscillation circuit 22 is expanded longer as the output voltage VB becomes higher.

In this manner, in the booster device according to the present embodiment, even in the situation that the output voltage VB of the battery 16 is decreased and thus the voltage VBB at the point P2 is decreased to the level at which the control IC 11 cannot be operated normally, the booster circuit 23 operates to increase the voltage VBB when the voltage VBB falls below the threshold voltage Vth. Therefore, the control IC 11 can be operated normally.

Also, there is no necessity that the special IC that can operate normally even when the voltage VBB is decreased should be employed. Therefore, it can be avoided that an increase in cost is brought about by such a situation.

With the above, the booster device of the present invention is explained based on the illustrated embodiment. But the present invention is not limited to this embodiment, and configurations of respective portions can be replaced by any configurations having the similar function respectively.

For example, in the above embodiment, an example that the battery that is installed into the vehicle is employed as the DC power supply is explained. But the present invention is not limited to this embodiment, and can be applied to the load circuit that employs other DC power supply.

Industrial Applicability

The present invention is very useful in operating the IC normally by increasing the voltage of the power supply when the voltage of the DC power supply is decreased temporarily.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-099779 filed on Apr. 16, 2009, the contents of which are incorporated herein for reference.

What is claimed is:

1. A booster device for increasing a voltage at a voltage supply point of a power supply circuit for supplying a driving voltage to an electronic control circuit, the power supply circuit including a first series-connected circuit having a diode, a resistor, and a capacitor which is connected to a DC power supply, wherein one end of the capacitor is connected to a ground and a connection point of the resistor and the capacitor serves as the voltage supply point, the booster device comprising:
a clamp circuit that outputs a drive disabling signal when the voltage at the voltage supply point is equal to or greater than a predetermined threshold voltage, and outputs a drive enabling signal, which is generated by inverting the drive disabling signal, when the voltage at the voltage supply point is smaller than the threshold voltage;
an oscillation circuit that outputs a pulse signal when the drive enabling signal is output from the clamp circuit; and
a booster circuit that increases the voltage at the voltage supply point by supplying electric charges, which are accumulated by a voltage output from the DC power supply, to the voltage supply point when the pulse signal is output from the oscillation circuit, wherein the clamp circuit includes:
a second series-connected circuit having a Zener diode (ZD1), a first resistor (R21), and a second resistor (R22), and provided between the voltage supply point and the ground; and
a first switching element (Q10) having a control electrode which is connected to a connection point of the first resistor and the second resistor, and the first switching element is switched to ON/OFF in response to a voltage generated in the second resistor; and
wherein the clamp circuit outputs the drive disabling signal when the first switching element is in an ON state, and outputs the drive enabling signal when the first switching element is in an OFF state.

2. A booster device for increasing a voltage at a voltage supply point of a power supply circuit for supplying a driving voltage to an electronic control circuit, the power supply circuit including a first series-connected circuit having a diode, a resistor, and a capacitor which is connected to a DC power supply, wherein one end of the capacitor is connected to a ground and a connection point of the resistor and the capacitor serves as the voltage supply point, the booster device comprising:
a clamp circuit that outputs a drive disabling signal when the voltage at the voltage supply point is equal to or greater than a predetermined threshold voltage, and outputs a drive enabling signal, which is generated by inverting the drive disabling signal, when the voltage at the voltage supply point is smaller than the threshold voltage;
an oscillation circuit that outputs a pulse signal when the drive enabling signal is output from the clamp circuit; and
a booster circuit that increases the voltage at the voltage supply point by supplying electric charges, which are accumulated by a voltage output from the DC power supply, to the voltage supply point when the pulse signal is output from the oscillation circuit, wherein the oscillation circuit includes:
a first capacitor which is charged when the drive enabling signal is supplied to the first capacitor;
a second switching element which is turned ON based on a charging voltage of the first capacitor; and
a third switching element which is turned OFF when the second switching element is turned ON; and
wherein the first capacitor starts discharging thereof when the third switching element is turned OFF, and starts charging thereof again when the second switching element is turned OFF due to a voltage drop of the first capacitor and then the third switching element is turned ON, so that repetition of charging/discharging operations outputs the pulse signal.

3. A booster device for increasing a voltage at a voltage supply point of a power supply circuit for supplying a driving voltage to an electronic control circuit, the power supply circuit including a first series-connected circuit having a diode, a resistor, and a capacitor which is connected to a DC power supply, wherein one end of the capacitor is connected to a ground and a connection point of the resistor and the capacitor serves as the voltage supply point, the booster device comprising:
a clamp circuit that outputs a drive disabling signal when the voltage at the voltage supply point is equal to or greater than a predetermined threshold voltage, and outputs a drive enabling signal, which is generated by inverting the drive disabling signal, when the voltage at the voltage supply point is smaller than the threshold voltage;
an oscillation circuit that outputs a pulse signal when the drive enabling signal is output from the clamp circuit; and
a booster circuit that increases the voltage at the voltage supply point by supplying electric charges, which are accumulated by a voltage output from the DC power supply, to the voltage supply point when the pulse signal is output from the oscillation circuit, wherein the oscillation circuit includes the first capacitor provided between an output terminal of the clamp circuit and the ground, a parallel circuit, a third series-connected circuit, a fourth series-connected circuit and a fifth series-connected circuit;
wherein the parallel circuit includes a first series connection having a third resistor, a fourth resistor, and a second switching element and a second series connection having a fifth resistor, a sixth resistor, and a third switching element;
wherein the first series connection is connected in parallel with the second series connection, one end of the parallel circuit is connected to the voltage supply point and other end of the parallel circuit is connected to a seventh resistor;

wherein a control electrode of the second switching element is connected to an output terminal of the clamp circuit, and one end of the second switching element is connected to the control electrode of the third switching element via a twelfth resistor;

wherein the third series-connected circuit includes a fourth switching element whose control electrode is connected to a connection point of the third resistor and the fourth resistor, an eighth resistor, and a ninth resistor, one end of the third series-connected circuit is connected to the voltage supply point and other end of the third series-connected circuit is connected to the ground;

wherein the fourth series-connected circuit includes a fifth switching element whose control electrode is connected to a connection point of the fifth resistor and the sixth resistor, a tenth resistor, and a first diode, and one end of the fourth series-connected circuit is connected to the voltage supply point and other end of the fourth series-connected circuit is connected to the output terminal of the clamp circuit;

wherein the fifth series-connected circuit includes a second diode, an eleventh resistor, and a sixth switching element, and one end of the fifth series-connected circuit is connected to the output terminal of the clamp circuit and other end is connected to the ground;

wherein a control electrode of the sixth switching element is connected to a connection point of the eighth resistor and the ninth resistor; and wherein a connection point of the eleventh resistor and the sixth switching element serves as an output point of the pulse signal.

4. A booster device for increasing a voltage at a voltage supply point of a power supply circuit for supplying a driving voltage to an electronic control circuit, the power supply circuit including a first series-connected circuit having a diode, a resistor, and a capacitor which is connected to a DC power supply, wherein one end of the capacitor is connected to a ground and a connection point of the resistor and the capacitor serves as the voltage supply point, the booster device comprising:

a clamp circuit that outputs a drive disabling signal when the voltage at the voltage supply point is equal to or greater than a predetermined threshold voltage, and outputs a drive enabling signal, which is generated by inverting the drive disabling signal, when the voltage at the voltage supply point is smaller than the threshold voltage;

an oscillation circuit that outputs a pulse signal when the drive enabling signal is output from the clamp circuit; and a booster circuit that increases the voltage at the voltage supply point by supplying electric charges, which are accumulated by a voltage output from the DC power supply, to the voltage supply point when the pulse signal is output from the oscillation circuit, wherein the booster circuit includes a second capacitor (C2) and a third capacitor (C3), one ends of which are connected to the DC power supply and other ends of which repeat alternately grounded/non-grounded states in accordance with a change of ON/OFF of the pulse signal;

wherein the booster circuit supplies electric charges, which are charged when the other end of the second capacitor (C2) is grounded, to the third capacitor (C3) when the other end of the second capacitor (C2) is changed into the non-grounded state, and charges the electric charges, which are supplied from the second capacitor (C2) into the third capacitor (C3) when the other end of the third capacitor (C3) is grounded; and wherein the booster circuit supplies the electric charges to the voltage supply point (P2) to increase the voltage at the voltage supply point (P2) when the other end of the third capacitor (C3) is changed into the non-grounded state.

* * * * *